US006803776B2

(12) United States Patent
So et al.

(10) Patent No.: US 6,803,776 B2
(45) Date of Patent: Oct. 12, 2004

(54) CURRENT-COMPARATOR-BASED FOUR-TERMINAL RESISTANCE BRIDGE FOR POWER FREQUENCIES

(75) Inventors: Eddy So, Ottawa (CA); Branislav Djokic, Ottawa (JP)

(73) Assignee: National Research Council of Canada, Ottawa (CA)

( * ) Notice: Subject to any disclaimer, the term of this patent is extended or adjusted under 35 U.S.C. 154(b) by 126 days.

(21) Appl. No.: 10/096,859

(22) Filed: Mar. 14, 2002

(65) Prior Publication Data

US 2003/0173984 A1 Sep. 18, 2003

(51) Int. Cl.[7] .................. G01R 27/08; G01R 27/10; G01R 25/00
(52) U.S. Cl. .................. 324/706; 324/725; 324/76.78; 324/99 R
(58) Field of Search ............... 324/706, 704, 324/659, 651, 691, 549, 715, 622, 99 R, 76.78

(56) References Cited

U.S. PATENT DOCUMENTS

| | | | | |
|---|---|---|---|---|
| 3,584,296 A | * | 6/1971 | Wolfendale | 324/660 |
| 3,786,349 A | * | 1/1974 | Devenyi | 324/658 |
| 4,322,679 A | * | 3/1982 | Moore et al. | 324/706 |
| 5,225,784 A | * | 7/1993 | So | 324/657 |

OTHER PUBLICATIONS

Kleinschmidt et al. (Cryogenic current comparator bridge for quantum Hall resistance ratio measurements (IEE Proceedings Sci. Meas. Technol., vol. 149, No 6, Nov. 2002, pp. 302–305).*

Eddy So and Djokic B. ("A Computer–Controlled Current–Comparator–Based Four–Terminal Resistance Bridge for Power Frequencies" IEEE Transactions on Instruments and Measurement, vol. 50, No. 2, Apr. 2001, pp. 272–274).*

So et al, IEEE Transactions on Instrumentation and Measurements, vol. IM–29, No. 4, Dec. 1980, pp. 364–366.

So et al, IEEE Transactions on Instrumentation and Measurements, vol. 50, No. 2, Apr. 2001, pp. 272–274.

* cited by examiner

*Primary Examiner*—Anjan K. Deb

(57) ABSTRACT

A current comparator technique is applied to four-terminal resistance measurements for obtaining a highly accurate AC resistance bridge at power frequencies of 50 Hz to 60 Hz. Active circuits are used to establish equal voltage drops between the potential terminals of the two resistances being compared. The bridge is suitable for measuring resistances from 10 $\mu\Omega$ to 100 k$\mu\Omega$. A cascading technique using two two-stage current transformers provides extension of the ratio range to 100,00,000 with a maximum applied current of 10,000 A. The bridge features measurement with a resolution of $0.1 \times 10^{-6}$. The total combined uncertainty ($2\sigma$) of the bridge including the range extenders, at power frequencies, is estimated to be less than 5 $\mu\Omega/\Omega$.

27 Claims, 2 Drawing Sheets

CURRENT-COMPARATOR-BASED FOUR-TERMINAL RESISTANCE BRIDGE FOR POWER FREQUENCIES

FIELD OF INVENTION

The invention resides in the area of measurements of electrical quantities, such as resistance or impedance. In particular, it is directed to a method and apparatus for measuring accurately the resistance or impedance of an element under measurement at the power frequency by the use of an AC current comparator.

BACKGROUND OF INVENTION

AC comparator bridges are used in a variety of applications including a field of electrical measurements, i.e., measurement of such electrical quantities as current, resistance, impedance, capacitance voltage etc. In the case of resistance measurement, an article entitled "A Direct-Reading AC Comparator Bridge for Resistance Measurement at Power Frequencies", So and Moore, IEEE Transactions on Instrumentation and Measurement, Vol. IM-29, No. 4, December 1980, pp 364–366 describes a current comparator technique for the measurement of resistance (impedance) at 50–60 Hz with high accuracy. In the technique described, the current in the unknown resistor is compared, using the current comparator, to the current in a reference resistor for the in-phase component and to the current in a reference capacitor for the quadrature component or phase defect.

A problem in the precise measurements of the ratio of low-value impedances is the effect of voltage drops in the connecting leads. This is overcome by applying four-terminal measurements. In the previous developments, including the technique described in the above article, active circuits are used to eliminate the effects of lead and winding impedances. Elimination of the effects of the leads at the high voltage ends of the unknown and reference resistors is accomplished by equalizing the potential terminals of the both resistors through an amplifier. At the low voltage end, the effects of lead and current comparator winding impedances are eliminated by an active circuit injecting a correction current into the low-end potential terminal of the reference resistor, so that the effective currents in the unknown and reference resistors are equal to those which would be obtained when the same voltage is applied to both resistors.

For most practical purposes this correction circuit is sufficient. However, it requires a resistor in the active circuit which is equal in magnitude to the reference resistor. The matching of the two resistors becomes more critical with an increase in the ratio of the voltage drop across the lead and the winding impedance and the voltage drop across the unknown resistor. This is inconvenient, especially if the reference resistor is to be changed to allow different ranges of the bridge. As mentioned earlier, prior techniques also require a reference capacitor in order to take into account the quadrature component or phase defect of the unknown resistor.

The present invention addresses these problems and presents an improved power-frequency current-comparator-based four-terminal resistance bridge, which does not require a correction circuit with matching resistors and does not require an external reference capacitor for quadrature current compensation, such as described in the above referenced article.

An adaptation to computer-controlled operation is facilitated by the simple, yet effective bridge structure.

An article entitled "A Computer-Controlled Current Comparator-Based Four-Terminal Resistance Bridge for Power Frequencies", So and Djokic, IEEE Transaction on Instrumentation and Measurement, Vol. 50, No. 2, April 2001, pp 272–274 describes the present invention. The inventor of the present invention is one of the coauthors of the article.

SUMMARY OF INVENTION

In accordance with an aspect, the invention relates to a bridge for measuring accurately an electrical parameter of an unknown element. It compares the unknown element and a reference element and uses an ampere-turn balance in a current comparator to derive the electrical parameter in relation to the reference element.

In accordance with a further aspect, the invention is directed to a current comparator-based bridge for measuring accurately an electrical parameter of an unknown element. It includes a current source for serially flowing a first electrical current through the unknown element and a current comparator and a buffer circuit bridging the unknown element and a reference element for flowing a second electrical current through a reference resistor, a sensing resistor and the current comparator. The bridge further includes a quadrature circuit for generating a quadrature component of the second electrical current through the current comparator and a controller circuit for controlling and sensing an ampere-turn balance in the current comparator to derive the electrical parameter of the unknown element in relation to the reference element.

In accordance with a further aspect, the invention is directed to an AC resistance bridge for measuring accurately an impedance, equivalent capacitive component or equivalent phase defect angle of an unknown element at a power frequency. The bridge comprises a current comparator having a plurality of windings, and a current source for supplying a first electrical current of the power frequency to a first AC circuit comprising the unknown element and a first winding of the current comparator. The bridge also includes a second AC circuit comprising a reference element, a current sensing element and a second winding of the current comparator, buffer amplifiers connecting the first and second AC circuits for supplying a second electrical current through the second AC circuit, and a quadrature circuit connected to the current sensing element to generate a quadrature current through a third winding of the current comparator. The bridge further comprises a sensing module for monitoring an ampere-turn balance in the current comparator to derive the impedance, equivalent capacitive component or equivalent phase defect angle of the unknown element in relation to the reference element.

DETAILED DESCRIPTION OF PREFERRED EMBODIMENTS OF INVENTION

Figure 1:
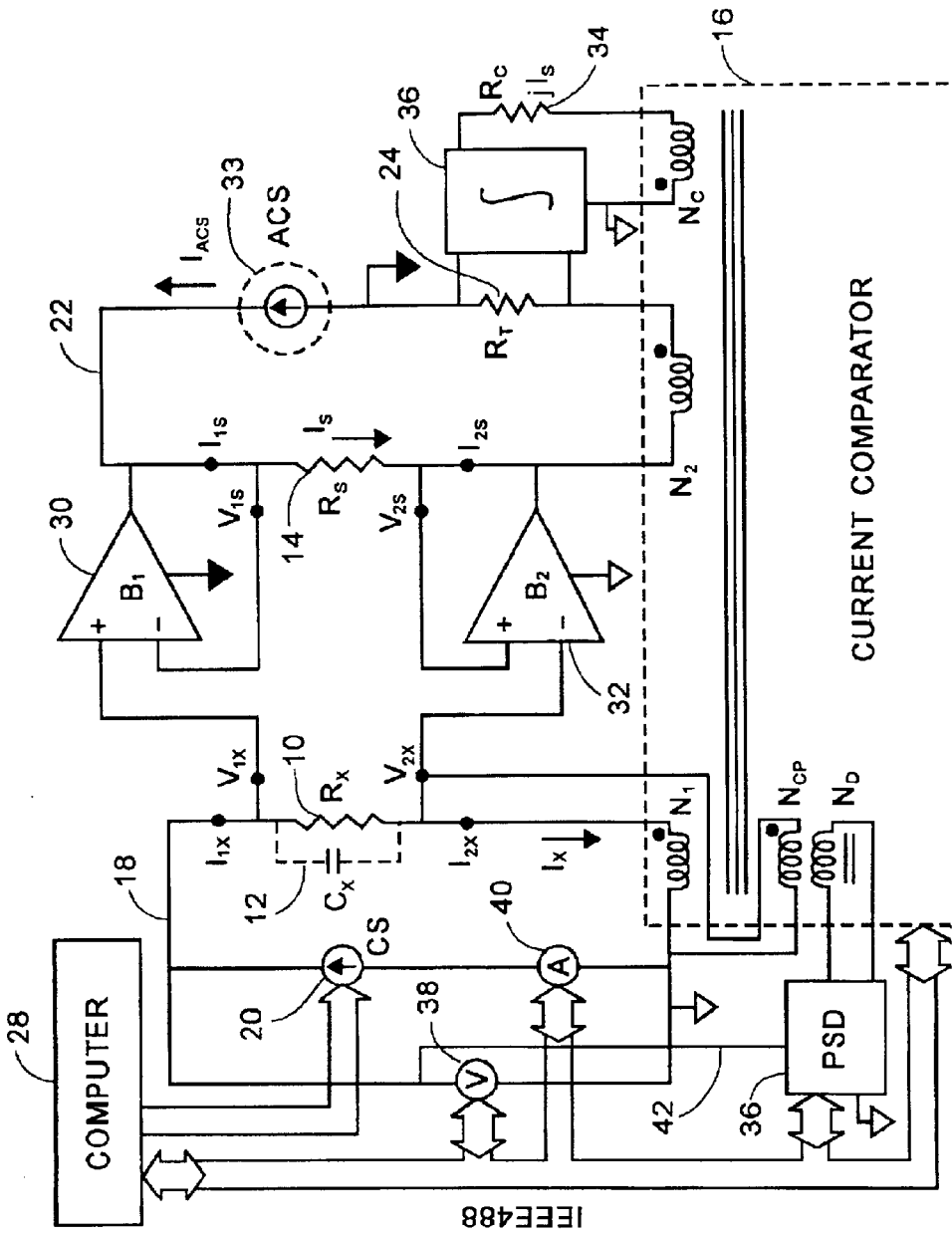
FIG. 1 is a basic circuit of the resistance bridge, according to one embodiment of the invention.

FIG. 1 shows the basic circuit of the bridge according to one embodiment of the invention. $R_X$ represents the unknown resistor 10 with its phase defect denoted as an equivalent parallel capacitor 12 designated by $C_X$. The reference resistor 14 is represented by $R_S$. A current comparator 16 includes windings: ratio windings $N_1$, $N_2$, quadrature winding $N_C$, compensation winding $N_{CP}$, and detection winding $N_D$. A first closed AC circuit 18 is formed with the unknown resistor 10, winding $N_1$ and a current source 20 designated by $C_S$. A second closed AC circuit 22 is formed with the reference resistor 14, winding $N_2$, and a current sensing resistor 24 represented by $R_T$.

The resistance bridge of the invention implements the definition of a four-terminal impedance, where the impedance is defined as the voltage between the two potential terminals divided by the current at one of the current terminals when the potential terminal adjacent to that current terminal is at ground potential and no current passes through the potential terminals. Referring to FIG. 1, in the first closed AC circuit, four terminals across the unknown resistor 10 consist of two potential terminals $V_{1X}$ and $V_{2X}$ and two current terminals $I_{1X}$ and $I_{2X}$. Similar terminals $V_{1S}$, $V_{2S}$, $I_{1S}$ and $I_{2S}$ are shown across the reference resistor 14 in the second closed AC circuit.

The bridge circuit is based on the establishment of equal voltage drops between the potential terminals of the two resistors being compared and the measurement of the corresponding current ratio.

Figure 2:
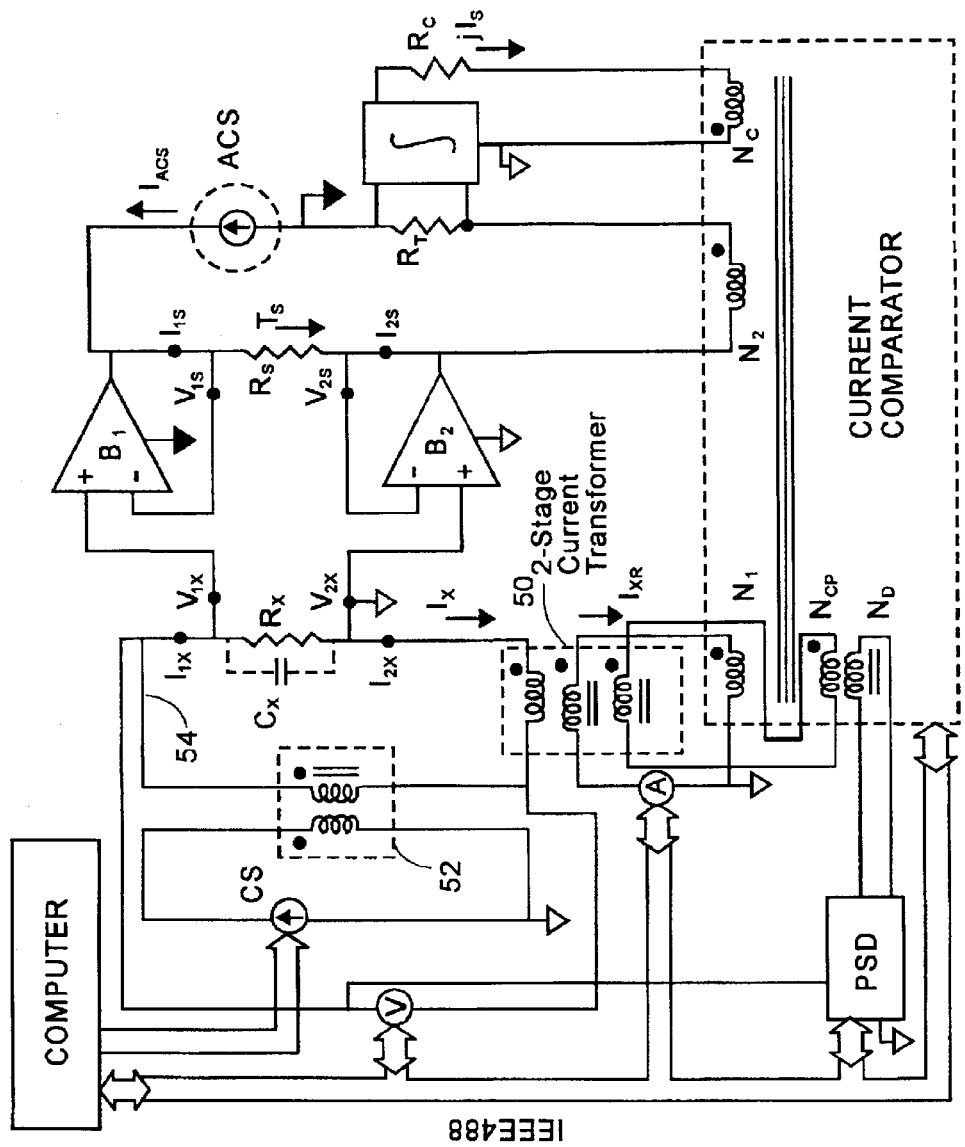
FIG. 2 is a circuit diagram of the bridge according to another embodiment of the invention.

A computer 28 switches the ratio windings of the current comparator 16 to measure the current ratio. The current comparator 16 can have a variety of winding ratios, e.g., 100/1 and is similar in design to the one described in the earlier article referenced above. As will be described below, a cascading technique, shown in FIG. 2, using two two-stage current transformers (only one is shown in FIG. 2) provides extension of the ratio range to 100,00,000 with a maximum applied current of 10,000 A.

Equal voltage drops $V_X$ across the unknown resistor $R_X$ 10 and the reference resistor $R_S$ 14 are accomplished using active circuits consisting of the current source $C_S$ 20, buffer amplifiers 30 and 32 represented respectively by $B_1$ and $B_2$. The equivalent phase defect (represented by the capacitor $C_X$ 12) of the unknown resistor $R_X$ is measured by means of a reference quadrature current in conjunction with the ratio winding $N_C$. The reference quadrature current $jI_S$ (phase shifted by 90°) is provided through a resistor $R_C$ 34 and the quadrature winding $N_C$ by an integrator block 36. It is equal in magnitude at a frequency $f_0$ to the current $I_S$ across the reference resistor 14. The input voltage to the integrator, in-phase with the current $I_S$, is obtained from a current sensing resistor $R_T$ 24. An unloading circuit (not shown in FIG. 1) is incorporated as a part of the integrator block 36 to ensure that the reference quadrature current is independent of the $N_C$ winding impedance. Obtaining a reference quadrature current $jI_S$ by means of a phase shifting device such as an integrator eliminates the need to have an external reference capacitor, such as described in the above-referenced earlier article.

The test current $I_X$ through the unknown resistor 10 and the $N_1$ ratio winding is derived from the current source CS 28. The low-voltage potential terminal $V_{2X}$ of the unknown resistor 10 is maintained at system ground potential (shown in FIG. 1 as a white triangle at several locations) through the compensation winding $N_{CP}$ of the current comparator 16. At ampere-turn balance the voltage drop across the compensation winding $N_{CP}$ is zero and thus $V_{2X}$ is at the ground potential. Equal voltage drops across the potential terminals of the unknown resistor 10 and reference resistor 14 are achieved through the buffer amplifiers $B_1$ 30 and $B_2$ 32. The buffer amplifiers 30 and 32 operate to maintain $V_{1X}=V_{1S}$ and $V_{2X}=V_{2S}$. The current $I_S$ through the reference resistor $R_S$ 14 and the $N_2$ ratio winding is provided by the buffer amplifiers $B_1$ 30 and $B_2$ 32. In other words, the buffer amplifiers 30 and 32 ensure that an appropriate current $I_S$ flows in the second AC circuit to generate the voltage drop $V_S$ across the reference resistor $R_S$ 14 to be equal to $V_X$. The buffer amplifier $B_1$ 30 is supplied from a separate power supply referred to as a signal ground, represented in FIG. 1 by a black triangle. It is preferable that the buffer amplifier $B_1$ 30 is required to supply the second AC circuit with a current $I_S$ which is manageable by it. In some instances, however, for example, when a relatively large current must be supplied through the reference resistor for one reason or another to create a appropriate voltage drop across, an auxiliary current source 33 designated by ACS can be optionally provided to supplement the current $I_S$.

Computer-controlled operation of the bridge is achieved through an IEEE-488 bus interface of the current comparator 16, a phase sensitive detector PSD 36, the voltmeter V 38, and the ammeter A 40. Another digital interface is used to control the current source CS 20.

The output of the detection winding $N_D$ is connected to the input of the phase sensitive detector PSD 36. A replica of the voltage $V_X$ between two potential terminals $V_{1X}$ and $V_{2X}$ is used as a reference signal at 42 for the PSD 36. The PSD 36 is used to resolve the $N_D$ output signal into two components, one that is in phase with the reference current, and the other that is in quadrature therewith.

Based on these two components, the required number of turns of the ratio windings to achieve ampere-turn balance can be calculated and set under computer-controlled operation. At the start of the measurement, in order to obtain an initial estimate of $R_X$, $N_1$ is set to 0 turns (as well as the other ratio windings) and $V_X$ and $I_X$ are measured by the voltmeter 38 and the ammeter 40. Two or three iterations are required to achieve a balance. Since the ratio windings have a resolution of $1\times10^{-6}$ the current comparator is considered to be in ampere-turn balance when the in-phase and quadrature components of the $N_D$ output signal in the PSD 36 are within the equivalent resolution of $1\times10^{-6}$ of their corresponding ratio windings. These residual output components are then further processed to obtain readout of the measured resistance corresponding to an equivalent improved balance of the current comparator with a resolution of $0.1\times10^{-6}$.

Once balance is achieved, the unknown resistance, as well as its equivalent capacitive component, can be derived from the balance relations:

$$R_X = \frac{N_1 + \Delta N_1}{N_2} R_S, \tag{1}$$

$$C_X = \frac{N_C + \Delta N_C}{N_1 + \Delta N_1} \frac{1}{R_S} \frac{f_0}{2\pi f^2}, \tag{2}$$

where $f_0=60$ Hz and f represents the actual test frequency measured by the PSD 36 from its reference signal. $\Delta N_1$ and $\Delta N_C$ represent fractional parts of $N_1$ and $N_C$, respectively, obtained by processing of the corresponding residual $N_D$ output components to achieve an equivalent improved balance of the current comparator with a resolution of $0.1\times10^{-6}$. The equivalent phase defect angle of $R_X$ at a test frequency f can be calculated from equations (1) and (2) above. For small phase angles, the equivalent phase defect angle $\delta$ in radians is equal to $2\pi f R_X C_X$.

Referring to FIG. 2, a further embodiment of the invention is described in detail. In addition to the same elements shown in FIG. 1, the circuit of this embodiment includes a 2-stage current transformer 50. The winding ratio of $N_1$ is therefore extended by this transformer 50 which necessitates insertion of an isolation transformer 52 to isolate the first closed AC circuit 54 from the current source. The ammeter measures the current through the winding $N_1$. The $N_D$ output is resolved by PSD as in the embodiment of FIG. 1. More than one 2-stage current transformer can be optionally provided to extend yet further the range in a further embodiment.

Performance

The uncertainty of the measurements performed by the resistance bridge is determined by the uncertainty of the ratios of the current comparator, including the ratio range extenders, the performance of the buffer amplifiers to maintain equal voltage drops across the unknown and the reference resistors, and, to a lesser degree (second order effect), the performance of the integrator in providing the reference quadrature current. The current comparator and the ratio range extenders were calibrated using a scale of gas-dielectric capacitors with substitution and build-up technique, and a current-comparator-based current transformer test set. All ratio errors were found to be not greater than $2 \times 10^{-6}$ in both magnitude and phase. These errors are accounted for in the computer-controlled operation of the bridge.

In this invention, the most important parameters of the buffer amplifiers are their gain and phase characteristics. These parameters are in particular critical for the $B_1$ amplifier 30. Using a current-comparator-based bridge with known errors, the unity gain error and phase shift of the amplifiers were found to be within $1 \times 10^6$ and 5 $\mu$rad, respectively, at power frequencies. The loading effect on these characteristics of amplifier $B_1$ was also evaluated by adding an additional load equal to the reference resistor $R_S$ between the $B_1$ output and its signal ground. No appreciable change in the bridge balance was observed.

For a phase defect of the unknown resistor of less than 1000 $\mu$rad, the effect of magnitude and phase errors of the reference quadrature current on the uncertainties of the measurements is less than $1 \times 10^{-6}$ in magnitude and 1 $\mu$rad in phase. For a phase defect greater than 1000 $\mu$rad, the errors introduced by the reference quadrature current can be accounted for in the computer-controlled operation of the bridge.

The performance of the AC resistance bridge was evaluated extensively at power frequencies by performing measurements on a number of stable low-temperature-coefficient resistors and reference resistors of various values, to test the bridge ratio errors. Their values, which were in the range of 0.01 $\Omega$ to 100 k$\Omega$, were repeatedly checked against each other and reference resistors of known values using a DC resistance bridge with an overall ratio uncertainty ($2\sigma$) of less than $10^{-7}$, and, wherever it was possible, at current levels that were also used in the measurements with the AC resistance bridge. For the resistance ratios of 1 to 100, the discrepancies in magnitude of the values measured by the AC resistance bridge with respect to those measured by the DC resistance bridge were found to be within $5 \times 10^{-6}$. The observed discrepancies during testing using the range extending two-stage current transformers were also within $5 \times 10^{-6}$.

The performance of the bridge in measurement of the quadrature component was evaluated by connecting a number of capacitors $C_X$ of known value in parallel with $R_X$. The measured values of the equivalent phase defect were compared to calculated values based on resistance and capacitance values. The agreement was found to be within 1 $\mu$rad.

The overall magnitude and phase errors of the components of the bridge are known from their respective calibrations. These known errors are taken into account through software by either applying corrections or offsetting the actual turns of the ratio windings. The remaining uncertainties, consequently, are only due to the calibration uncertainties. The uncertainties ($2\sigma$) of each calibration of the individual components, including the current comparator and range extenders, the buffer amplifiers, and the integrator, are less than $2.5 \times 10^{-6}$ in both magnitude and phase. Therefore, the total combined uncertainty ($2\sigma$) of the bridge for the measurements of four-terminal resistance ratios at power frequencies, including the range extenders, is estimated to be less than $5\mu\Omega/\Omega$.

What is claimed is:

1. A current comparator-based bridge for measuring accurately an electrical parameter of an unknown element having two current terminals and two potential terminals, said bridge comprising:

a current source for serially flowing a first electrical current through the unknown element and a current comparator;

a buffer circuit bridging the unknown element and a reference element, each having two current terminals and two potential terminals for flowing a second electrical current through a reference resistor, a current sensing element and the current comparator;

said buffer circuit having first and second buffers and being adapted to equalize voltage drop between the potential terminals of the unknown element and voltage drop between the potential terminals of the reference element, a quadrature circuit connected to the sensing element for generating a quadrature component of the second electrical current through the current comparator; and a controller circuit for controlling and sensing an ampere-turn balance in the current comparator to derive the electrical parameter of the unknown element in relation to the reference element.

2. The current comparator-based bridge according to claim 1, wherein the current source is an AC source of power frequency.

3. The current comparator-based bridge according to claim 2, wherein the quadrature circuit includes a phase shifting module and takes its input at the current sensing element to generate the quadrature component of the second electrical current.

4. The current comparator-based bridge according to claim 3, wherein the controller circuit includes a phase sensitive detector for detecting in-phase and quadrature component of an output of the current comparator to sense an ampere-turn balance.

5. The current comparator-based bridge according to claim 4, wherein the controller circuit further includes a computer for adjusting the turn-ratio of current comparator for the ampere-turn balance.

6. The current comparator-based bridge according to claim 5, further comprising:

at least one two-stage current transformer connected between the current transformer and the unknown element, and an isolation transformer between the current source and the unknown element to expand a measurement range.

7. The current comparator-based bridge according to claim 2, wherein, the controller circuit includes a phase sensitive detector for detecting in-phase and quadrature component of an output of the current comparator to sense an ampere-turn balance.

8. The current comparator-based bridge according to claim 7, wherein the controller circuit further includes a computer for adjusting the turn-ratio of current comparator for the ampere-turn balance.

9. The current comparator-based bridge according to claim 8, further comprising:
at least one two-stage current transformer connected between the current transformer and the unknown element, and an isolation transformer between the current source and the unknown element to expand a measurement range.

10. The current comparator-based bridge according to claim 2, further comprising an auxiliary current source to supplement the second electrical current through the reference resistor.

11. The current comparator-based bridge according to claim 10, wherein the quadrature circuit includes a phase shifting module and takes its input at the current sensing element to generate the quadrature component of the second electrical current.

12. The current comparator-based bridge according to claim 11, wherein the controller circuit includes a phase sensitive detector for detecting in-phase and quadrature component of an output of the current comparator to sense an ampere-turn balance.

13. The current comparator-based bridge according to claim 12, wherein the controller circuit further includes a computer for adjusting the turn-ratio of current comparator for the ampere-turn balance.

14. The current comparator-based bridge according to claim 13, further comprising:
at least one two-stage current transformer connected between the current transformer and the unknown element, and an isolation transformer between the current source and the unknown element to expand a measurement range.

15. The current comparator-based bridge according to claim 10, wherein the controller circuit includes a phase sensitive detector for detecting in-phase and quadrature component of an output of the current comparator to sense an ampere-turn balance.

16. The current comparator-based bridge according to claim 15, wherein the controller circuit further includes a computer for adjusting the turn-ratio of current comparator for the ampere-turn balance.

17. The current comparator-based bridge according to claim 16, further comprising:
at least one two-stage current transformer connected between the current transformer and the unknown element, and an isolation transformer between the current source and the unknown element to expand a measurement rang.

18. An AC resistance bridge for measuring accurately an impedance, equivalent capacitive component or equivalent phase defect angle of an unknown element at a power frequency, comprising:
a current comparator having a plurality of windings;
a current source for supplying a first electrical current of the power frequency to a first AC circuit comprising the unknown element having two current terminals and two potential terminals, and a first winding of the current comparator;

a second AC circuit comprising a reference element having two current terminals and two potential terminals, a current sensing element and a second winding of the current comparator, buffer amplifiers connecting the first and second AC circuits for supplying a second electrical current through the second AC circuit and being adapted to equalize the potential at the potential terminals of the unknown and reference elements;

a quadrature circuit connected to the current sensing element to generate a quadrature current through a third winding of the current comparator; and a sensing module for monitoring an ampere-turn balance in the current comparator to derive the impedance, equivalent capacitive component or equivalent phase defect angle of the unknown element in relation to the reference element.

19. An AC resistance bridge according to claim 18, wherein the quadrature circuit includes an integrator and takes an input across the current sensing element to generate the quadrature component of the second electrical current.

20. The current comparator-based bridge according to claim 19, wherein the sensing module includes a phase sensitive detector for detecting in-phase and quadrature component of an output of the current comparator to sense an ampere-turn balance.

21. The current comparator-based bridge according to claim 20, wherein the sensing module further includes a computer which adjusts the turn-ratio of current comparator for the ampere-turn balance.

22. The current comparator-based bridge according to claim 21, further comprising:
at least one two-stage current transformer connected between the current transformer and the unknown element, and an isolation transformer between the current source and the unknown element to expand a measurement range.

23. The current comparator-based bridge according to claim 18, further comprising an auxiliary current source to supplement the second electrical current through the second AC circuit.

24. An AC resistance bridge according to claim 23, wherein the quadrature circuit includes an integrator and takes an input across the current sensing element to generate the quadrature component of the second electrical current.

25. The current comparator-based bridge according to claim 24, wherein the sensing module includes a phase sensitive detector for detecting in-phase and quadrature component of an output of the current comparator to sense an ampere-turn balance.

26. The current comparator-based bridge according to claim 25, wherein the sensing module further includes a computer which adjusts the turn-ratio of current comparator for the ampere-turn balance.

27. The current comparator-based bridge according to claim 26, further comprising:
at least one two-stage current transformer connected between the current transformer and the unknown element, and an isolation transformer between the current source and the unknown element to expand a measurement range.

* * * * *